United States Patent
Smith et al.

(10) Patent No.: US 8,866,468 B2
(45) Date of Patent: Oct. 21, 2014

(54) DF/DT TRIGGER SYSTEM AND METHOD

(75) Inventors: Patrick A. Smith, Beaverton, OR (US); Daniel G. Knierim, Beaverton, OR (US); John C. Calvin, Portland, OR (US); Shane A. Hazzard, North Plains, OR (US)

(73) Assignee: Tektronix, Inc., Beaverton, OR (US)

( * ) Notice: Subject to any disclaimer, the term of this patent is extended or adjusted under 35 U.S.C. 154(b) by 499 days.

(21) Appl. No.: 13/015,128

(22) Filed: Jan. 27, 2011

(65) Prior Publication Data

US 2012/0194169 A1 Aug. 2, 2012

(51) Int. Cl.
*G01R 23/14* (2006.01)
*G01R 13/02* (2006.01)
*H03L 7/093* (2006.01)
*G01R 23/02* (2006.01)
*G01R 31/317* (2006.01)

(52) U.S. Cl.
CPC ............ *G01R 13/0254* (2013.01); *G01R 23/02* (2013.01); *G01R 31/31727* (2013.01); *H03L 7/093* (2013.01)
USPC ..... 324/76.41; 327/156; 375/376; 324/76.19; 324/76.53

(58) Field of Classification Search
None
See application file for complete search history.

(56) References Cited

U.S. PATENT DOCUMENTS

| | | | |
|---|---|---|---|
| 6,879,645 B1 * | 4/2005 | Webber et al. | 375/317 |
| 2003/0058970 A1 * | 3/2003 | Hamre et al. | 375/342 |
| 2005/0062550 A1 * | 3/2005 | Melanson | 331/17 |
| 2006/0074607 A1 * | 4/2006 | Weller | 702/190 |
| 2009/0179678 A1 * | 7/2009 | Hardin et al. | 327/165 |
| 2010/0214031 A1 * | 8/2010 | Yamamoto et al. | 331/34 |
| 2010/0228508 A1 * | 9/2010 | Smith et al. | 702/68 |
| 2011/0025386 A1 * | 2/2011 | Lamanna et al. | 327/156 |

* cited by examiner

*Primary Examiner* — Melissa Koval
*Assistant Examiner* — Stephen G Armstrong
(74) *Attorney, Agent, or Firm* — Marger Johnson & McCollom PC; Thomas F. Lenihan

(57) ABSTRACT

A dF/dT trigger system and method includes instantaneously triggering on a frequency deviation of a data signal, which can be associated with an SSC signal. After receiving a signal at an input terminal of a test and measurement instrument, the signal is low-pass filtered and transmitted to trigger circuitry. When a frequency deviation rate in the filtered signal exceeds or crosses one or more thresholds, a trigger event is produced. Also disclosed is a test and measurement instrument including an input terminal to receive the signal, input circuitry to receive and process the signal, and dF/dT trigger circuitry configured to receive the signal and produce a trigger event when a frequency deviation in the signal exceeds or crosses one or more thresholds.

21 Claims, 9 Drawing Sheets

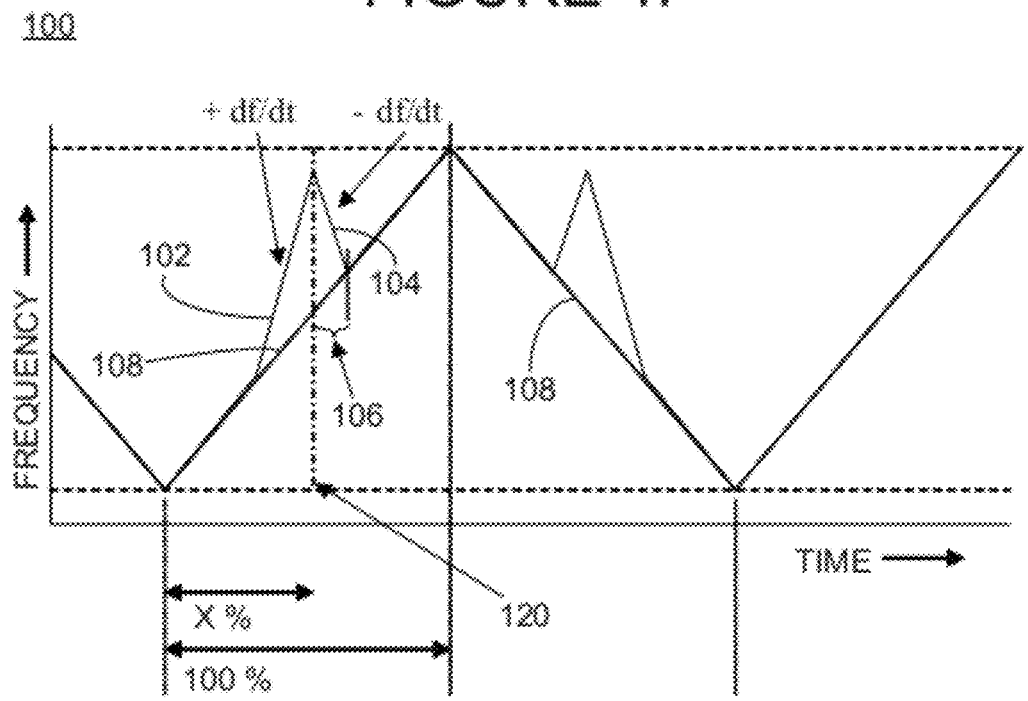

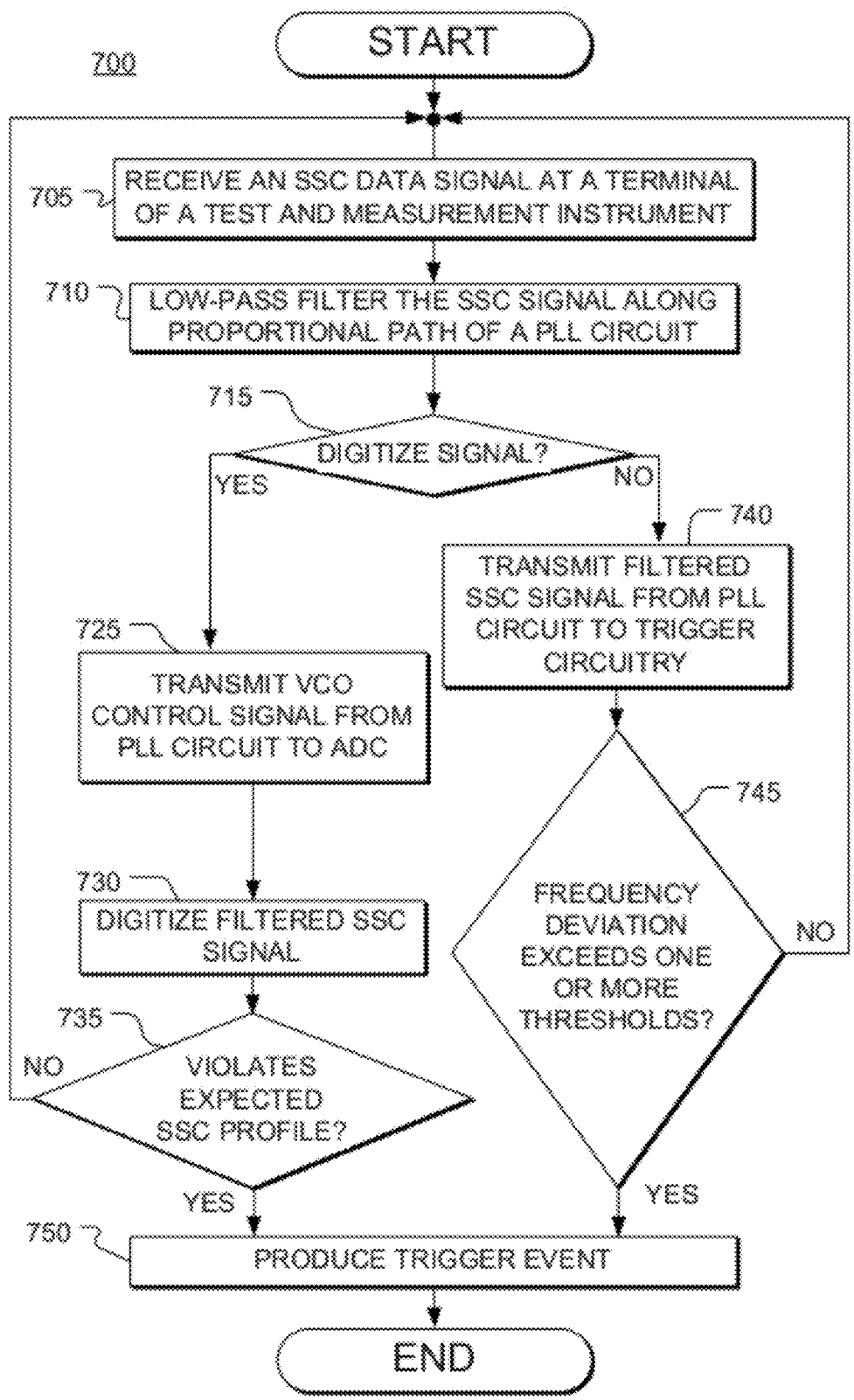

DF/DT TRIGGER SYSTEM AND METHOD

BACKGROUND

Serial data streams are regularly subjected to a spread spectrum clocking (SSC) modulation scheme in order to lower the magnitude of the electromagnetic interference (EMI) radiation, which would otherwise be emitted at a single frequency in electronic products. For example, hard disk drives, personal computers, and computer monitors, among other electronics, use SSC modulation to lower EMI.

A common SSC modulation scheme implements a simple triangular frequency modulation form, which down-spreads the center frequency of a data signal's fundamental from −5000 to 0 parts per million (PPM). FIG. 1A shows an example of the resulting ideal shape of the frequency versus time trace associated with this approach. This type of trace would correspond to, for example, a laboratory grade 5000 PPM down-spread SSC profile used with a second generation serial advanced technology attachment (SATA) hard disk drive signal.

Consumer-grade clock generators often perform poorly in terms of stability and tend to generate problematic signals that can deviate outside of what is permitted based on specifications or other definitions. This can result in spikes or other deviations in the signal, such as spike 10 illustrated in FIG. 1B. Other problematic deviations include, for example, the "Batman" profile 12 shown in FIG. 1C, the "1:100 SSC glitch" profile 14 shown in FIG. 1D, and the "Noisy SSC" profile with transition fringes 16 as shown in FIG. 1E.

The electronics industry is becoming more aware of the problems caused by errant SSC modulated signals. Efforts to better define what constitutes a spike or a deviation in an SSC signal have been proposed. For example, a "dF/dT" (delta Frequency/deltaTime) definition has been put forward, which can be used on the demodulated SSC signal to define errant spikes. For instance, in FIG. 1F, a desired modulated SSC signal is shown as line 108. However, a spike having a first component 102 and a second component 104 occurs at position 120. Position 120 can correspond to X % of a generally sloped section 108 of the demodulated SSC signal, as shown in FIG. 1F.

The first component 102 of the spike or deviation corresponds to +df/dt and the second component 104 corresponds to −df/dt, or in other words, the positive and negative sloping components of the spike. An errant or deviant spike can be defined by whether the magnitude of the spike exceeds a value, such as 1875 PPM, within a moving average time interval (e.g., 106). The time interval is sometimes defined as 1.5 microseconds.

Various specifications and protocols such as SATA, serial attached SCSI (SAS), DisplayPort, and PCI Express, have incorporated limitations for SSC signal deviations, and signals falling outside of this or similar definitions are considered "non-conformant." However, conventional real-time (RT) oscilloscope trigger systems do not have the ability to detect such errant events as they happen. And since dF/dT spikes can occur irregularly, it would be desirable to immediately isolate such events without searching a long record capture in the hopes of finding the event. Searching captured records is computationally expensive and can take on the order of minutes. Moreover, conventional RT oscilloscopes have an extremely low probability of having infrequent events in acquisition memory, which results in overly-conservative jitter reporting.

Therefore, it is difficult or impossible to diagnose dF/dT problems in the SSC signals, or other types of signals, or to make complete and timely determinations of the presence or absence of deviations in the signals.

SUMMARY

Embodiments of the subject invention provide measurement techniques for instantaneously triggering and isolating frequency deviations in a signal, such as one or more signals associated with a spread spectrum clock (SSC) signal. In some embodiments, the signal is a data signal having little or no SSC modulation. After receiving a signal, such as a data signal based on an SSC signal at an input terminal of a test and measurement instrument, the SSC signal is low-pass filtered and transmitted to trigger circuitry. When a frequency deviation in the filtered SSC signal exceeds or crosses one or more thresholds, a trigger event is produced.

In some example embodiments, an input terminal of a test and measurement instrument receives an SSC data signal and initially processes the SSC data signal using input circuitry such as a data input equalizer, slicer, MUX, decision feedback equalizer, or other suitable pre-processing. The dF/dT trigger circuitry is coupled to the input circuitry, and is configured to receive the SSC data signal and produce a trigger event when a frequency deviation in the SSC signal exceeds or crosses one or more user-defined or predefined thresholds.

The dF/dT trigger circuitry can be embodied in various forms. For instance, the dF/dT trigger circuitry can include a phase lock loop (PLL) circuit to filter the signal and trigger circuitry to produce the trigger event when the frequency deviation in the SSC signal exceeds or crosses one or more window trigger thresholds. Alternatively, the dF/dT trigger circuitry can include an analog-to-digital converter (ADC) and a digital signal processor (DSP). The ADC can receive and digitize a signal received from the PLL circuit, and the DSP can receive the digitized signal and produce the trigger event when the digitized signal violates a predefined expected SSC profile, mask, and/or pattern.

BRIEF DESCRIPTION OF THE DRAWINGS

FIG. 1F illustrates various components of one example of a deviant SSC modulated signal.

FIG. 7 illustrates a flow diagram showing a technique for receiving an SSC data signal and producing a trigger event.

DETAILED DESCRIPTION

Figure 1A:
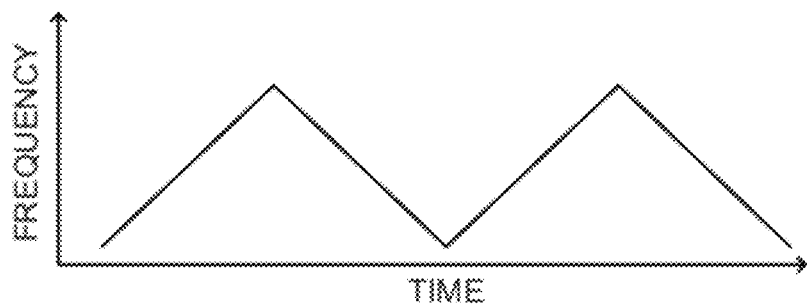
FIG. 1A illustrates a simplified frequency versus time trace of a desirable spread spectrum clock (SSC) modulated signal.
Figure 1B:
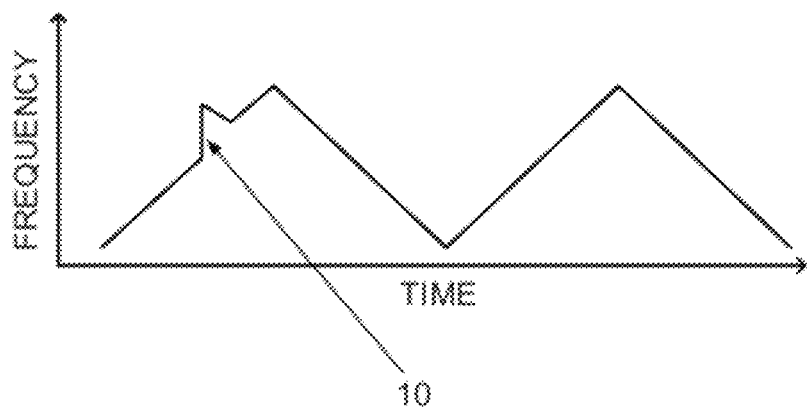
FIG. 1B illustrates a simplified frequency versus time trace of a deviant SSC modulated signal.
Figure 1C:
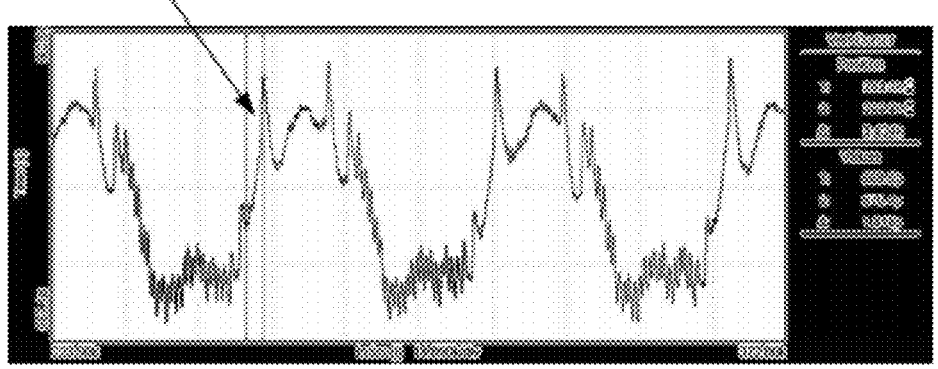
FIGS. 1C-1E illustrate possible deviations or non-conforming traces in SSC modulated signals.
Figure 1D:
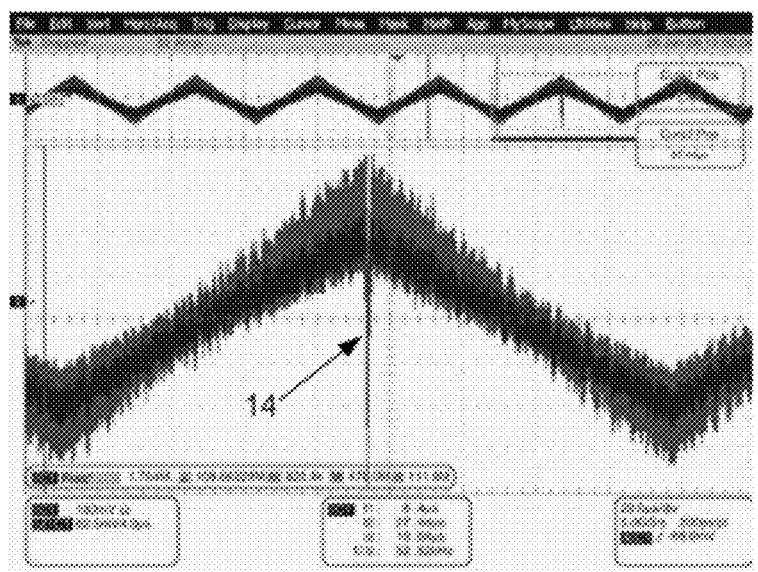
Figure 1E:
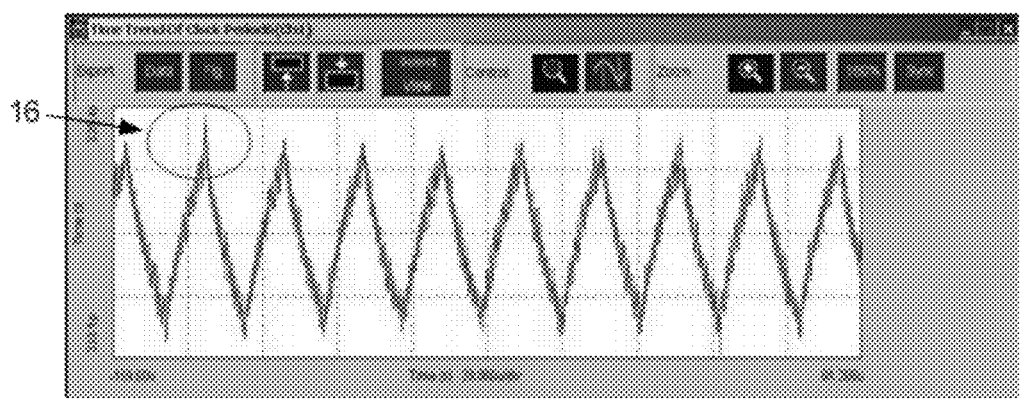
Figure 2:
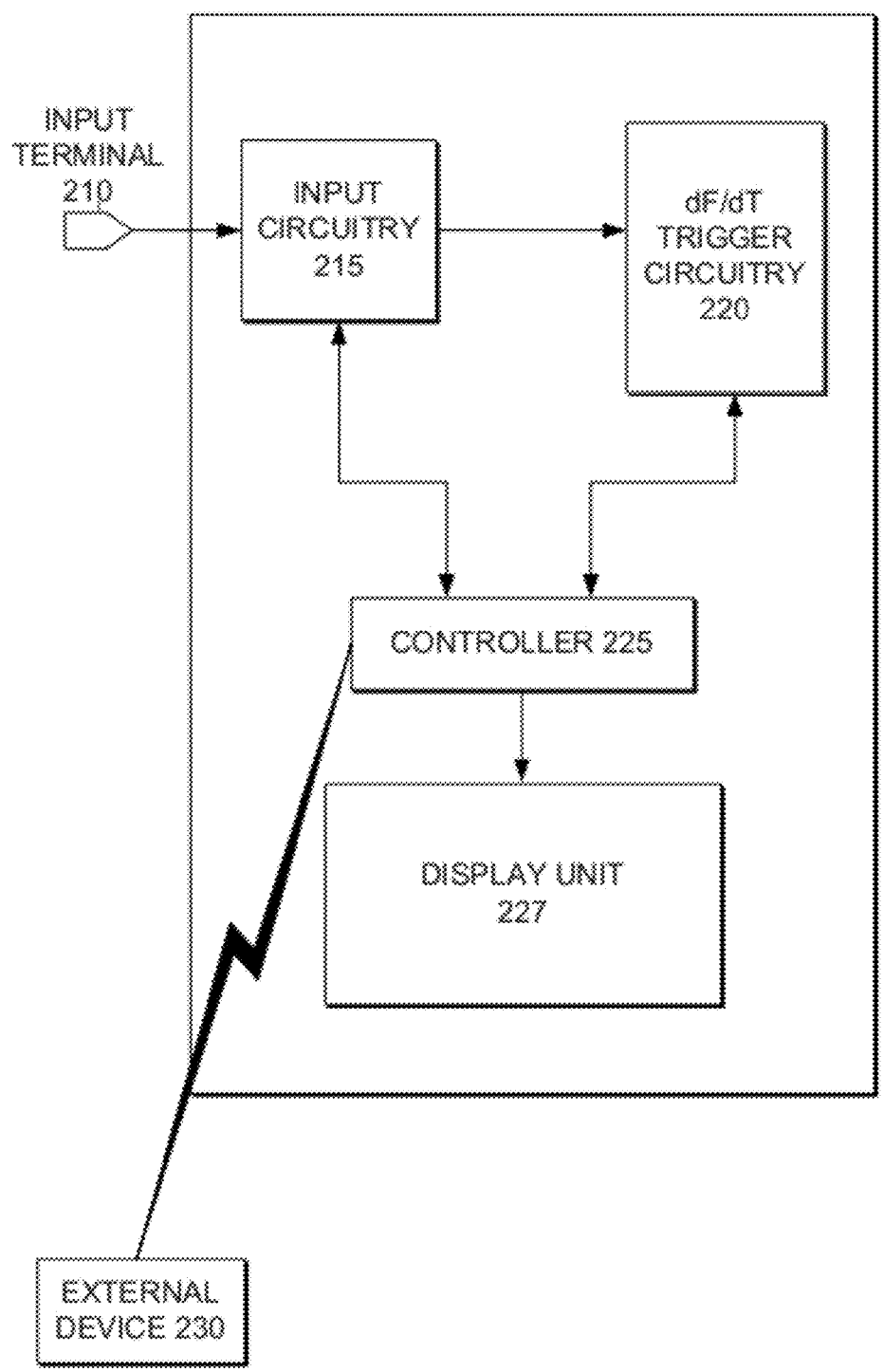
FIG. 2 illustrates a simplified block diagram of one embodiment of a test and measurement instrument according to the present invention, including an input terminal, input circuitry, a controller, a display unit, and dF/dT trigger circuitry.

FIG. 2 illustrates a simplified block diagram of one embodiment of a test and measurement instrument 200 according to the present invention, including an input terminal 210, input circuitry 215, a controller 225, a display unit 227, and dF/dT trigger circuitry 220. The test and measurement instrument 200 can be an RT digital oscilloscope or other suitable test and measurement instrument. For the sake of brevity and consistency, but not limitation, the test and measurement instrument will generally be referred to herein as an oscilloscope.

The oscilloscope 200 may have multiple channels or inputs, such as input terminal 210, suitable for use with various embodiments as described herein. Although the oscilloscope may have a single input terminal 210, inventive aspects described are equally applicable to an oscilloscope having four inputs, or any number of inputs. While components of the oscilloscope 200 are shown to be directly coupled to each other, it should be understood that the oscilloscope 200 can include a variety of other circuit or software components, inputs, outputs, and/or interfaces, which are not necessarily shown, but that are disposed between or otherwise associated with the illustrated components of oscilloscope 200.

An electrical signal under test, for example, a data signal based on an SSC signal, is received at the input terminal 210. Input circuitry 215 receives the signal and pre-processes the signal. For example, the input circuitry 215 can include a data input equalizer, a slicer, or a MUX. In some embodiments, the input circuitry 215 can include decision feedback equalizer (DFE) circuitry, a filter, or any other suitable component for processing or improving the signal under test before transmitting the signal to other components of the oscilloscope. The input circuitry 215 can include a single hardware chip or component, or alternatively, any number of hardware chips or components, performing a variety of tasks.

Even though the input circuitry 215 can modify or improve the signal, modulate or demodulate the signal, etc., such modified or improved signal will generally be referred to herein simply as the "SSC data signal." Such reference to the SSC data signal should not be construed so as to limit the types or forms in which the underlying SSC signal, or related signals or components, can be embodied in any way. It should also be understood that the SSC signal can be a data signal based on an SSC signal. In some embodiments, the data signal can have little or no intentional SSC modulation.

The dF/dT trigger circuitry 220 is operatively coupled to the input circuitry 215 and configured to receive the SSC data signal. The dF/dT trigger circuitry 220 produces a trigger event when a dF/dT of the signal exceeds or crosses one or more thresholds. For example, if a frequency deviation in the SSC signal exceeds or crosses one or more thresholds, then the dF/dT trigger circuitry 220 can produce the trigger event. The one or more trigger thresholds can be user-definable or predefined in the system. The dF/dT trigger circuitry 220 and functionality is described in more detail below with reference to FIGS. 3-7.

A controller 225 is operatively coupled to the input circuitry 215 and the dF/dT trigger circuitry 220. The controller 225 is also coupled to the display unit 227, which is adapted to display one or more SSC modulated or demodulated traces, dF/dT trigger control and/or trigger information. The controller 225 also processes the signals under test, and produces corresponding waveforms, traces, and/or measurements for display by the display unit 227. Alternatively, or in addition to displaying the traces and measurements, the controller 225 can transmit these to an external device 230 via a conductor such as a bus or a wire. The external device 230 can include, for example, a computer separate from the oscilloscope 200, or an external memory device, among other possibilities.

Any of the components of the oscilloscope 200 may exist in or be implemented using hardware, software, firmware, or by any combination thereof. For example, some of the components disclosed herein are preferably implemented using a digital signal processor (DSP), field programmable gate array (FPGA), or other suitable hardware circuit components.

Figure 3:
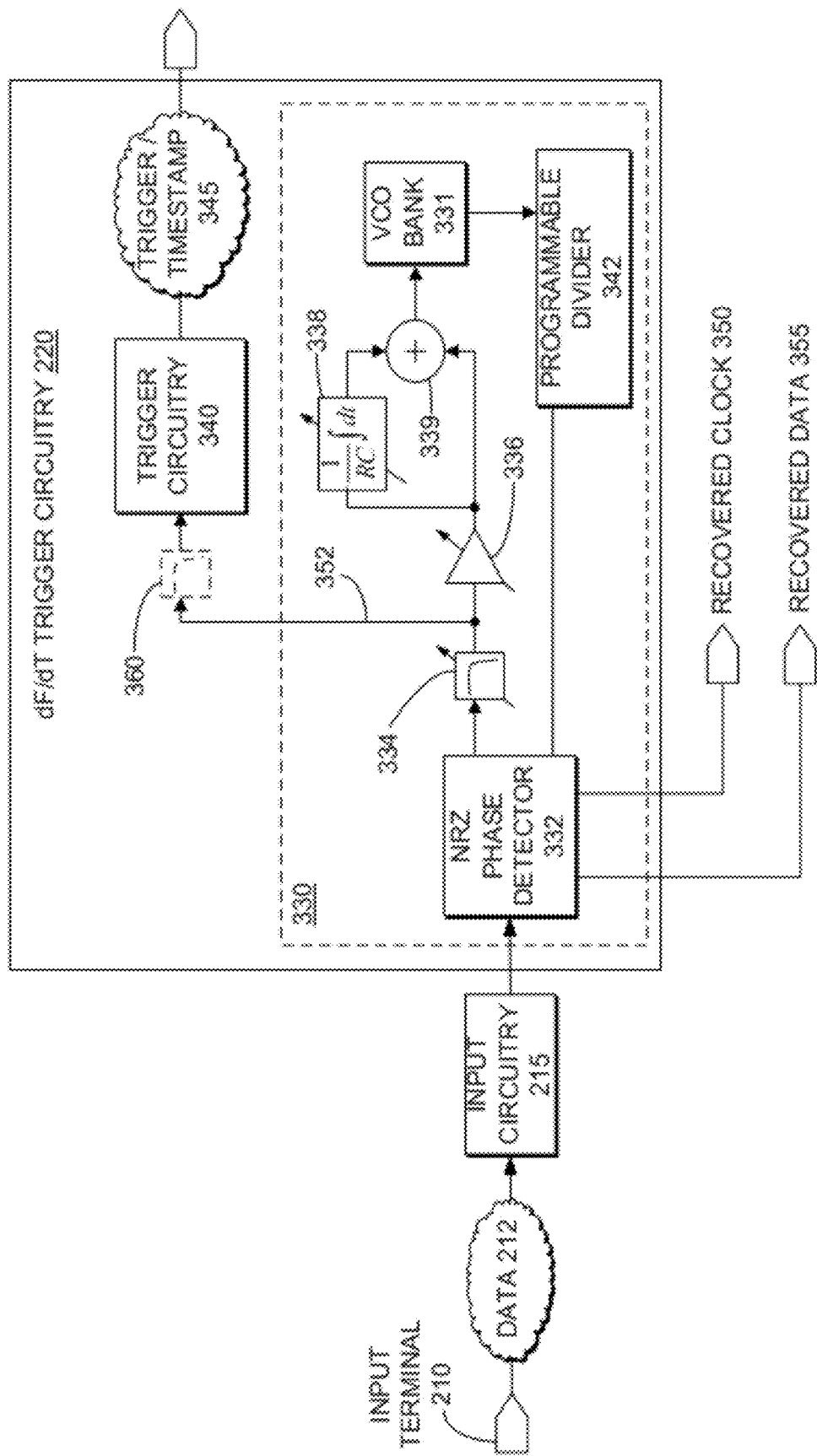
FIG. 3 illustrates the dF/dT trigger circuitry of FIG. 2, according to some embodiments of the present invention.

FIG. 3 illustrates the dF/dT trigger circuitry 220 of FIG. 2, including trigger circuitry 340, according to some embodiments of the present invention. The dF/dT trigger circuitry is coupled to the input circuitry 215, which receives data 212. Data 212 essentially includes the electrical signal under test as received at terminal 210, which in some embodiments is an SSC signal.

The dF/dT circuitry 220 can include a phase lock loop (PLL) circuit 330. The PLL circuit 330 can include, for example, a non-return-to-zero (NRZ) phase detector 332, which outputs recovered clock 350 and recovered data 355. The phase detector 332 is coupled to an adjustable low-pass filter 334, which reduces high frequency noise in the signal. An adjustable gain component 336 is coupled to the adjustable low-pass filter 334 and is structured to adjust a signal gain. An adjustable integrator 338 is coupled to the output of the adjustable gain component 336. The PLL loop bandwidth is preferably set to 100 KHz, or thereabout, which corresponds to the 1.5 microsecond time interval discussed above. It should be understood, however, that the time interval can be 1 microsecond, 10 microseconds, 100 nanoseconds, among other possibilities, and the bandwidth of the PLL can be set accordingly. Indeed, the time interval can be set to any suitable time interval based on any specification or definition in which the signal is to be confined according to the needs of the user of the oscilloscope.

The outputs of the adjustable gain component 336 and the adjustable integrator 338 are coupled to summer 339, which adds the output signals of the adjustable integrator 338 and the adjustable gain component 336 of the PLL, and outputs the corresponding added signal to a voltage-controlled oscillator (VCO) bank 331, which tunes the signal and creates an output frequency signal. The output frequency signal is optionally fed through a programmable divider 342, and back to the phase detector 332, thereby creating a feedback loop.

It should be understood that while one example embodiment of the PLL circuit 330 is described, other variations in the PLL circuit are contemplated. For instance, the PLL circuit can include digital and/or analog components, and can have a variety of different components, which can be used together with or in place of the components described herein, as understood by persons having skill in the art. Although a clock-recovery PLL is illustrated and can be used, other types of PLL circuits can be used.

In a clock-recovery PLL, the integral path output produces a voltage that is proportional to the recent average input data frequency, whereas the proportional path output produces a voltage that is proportional to the input data frequency deviation from its recent average. An integrator by nature rejects high frequencies rather than passes them. Thus the integrator 338, when used in a feedback loop (e.g., as included in PLL 330), causes the feedback loop to place greater high-frequency energy on its input to compensate for the integrator's low gain at high frequency. This high-pass filtering effect of the entire loop, as seen at the integrator's input, provides a derivative and/or a derivative approximation for the dF/dT trigger circuitry. The dF/dT trigger circuitry 220 of FIG. 3 includes the phase detector 332 and adjustable low-pass filter 334 for producing a proportional output signal. The proportional path output is coupled to trigger circuitry 340, which receives the proportional output signal of the PLL. The output of the adjustable low-pass filter 334 is connected to the trigger circuitry 340 through an optional additional low-pass filter 360. The additional low-pass filter 360 can further reduce high frequency noise between the proportional path output and the trigger circuitry 340.

Magnitude and duration thresholds of any deviation or excursion in the signal can be specified, and such thresholds can be monitored using the trigger circuitry 340. For instance, when the magnitude of a frequency or voltage deviation and/or the duration of a frequency or voltage deviation in the SSC signal exceed one or more user-defined or predefined thresholds, the trigger circuitry 340 produces a trigger event 345. In other words, the trigger circuitry 340 produces the trigger event 345 responsive to the proportional path output signal of the PLL circuit 330. The trigger event 345 can include a signal, a timestamp, or other suitable indicator that a threshold has been crossed, but will generally be referred to herein as simply the "trigger event."

It should be understood that the trigger circuitry 340 can be embodied in various forms and can operate under different conditions using a variety of parameters. In some embodiments, the trigger circuitry 340 is window trigger circuitry and implements a window trigger. Although a window trigger can be implemented where the oscilloscope triggers on an event when the signal enters or exits a window in either direction, in a preferred embodiment, the oscilloscope triggers on the event when the signal exits the window in either direction. The window can be defined by two or more user-adjustable voltage or amplitude thresholds. In other words, if a signal such as the SSC signal crosses or exits one or more of the user-adjustable thresholds, then the trigger event 345 can occur. In some embodiments, a time qualifier can be used, completing a rectangular time window. In such a case, if a signal, such as the SSC signal, exits the rectangular time window, the trigger event 345 can be caused.

In some embodiments, the trigger circuitry 340 produces the trigger event 345 when dF/dT exceeds 1875 PPM, where dT is 1.5 microseconds. Alternatively, the trigger circuitry 340 produces the trigger event when a phase displacement occurs where the magnitude exceeds or crosses one or more user-defined or predefined trigger thresholds. It should be understood that rather than 1.5 microseconds, the time interval can be 1 microsecond, 10 microseconds, 100 nanoseconds, among other possibilities. Indeed, the time interval can be set to any suitable time interval based on any specification or definition in which the signal is to be confined according to the needs of the user of the oscilloscope.

Moreover, the dF/dT trigger circuitry 220 can instantaneously trigger on the frequency or voltage deviations in the SSC signal (i.e., as the trigger events happen) and cause the deviation or trigger events to be displayed using display unit 227. In this manner, the oscilloscope 200 isolates the offending event such as when a dF/dT spike occurs, even if such a spike occurs irregularly.

In some embodiments, a threshold can be set for the trigger circuitry 340 that corresponds to a value higher than 1875 PPM per 1.5 microseconds, for example, 2000 PPM per 1.5 microseconds, and then the threshold can be progressively lowered. If the trigger circuitry 340 produces a trigger before reaching the threshold corresponding to 1875 PPM, then it can be determined that the SSC signal is non-conformant. The upper starting threshold can begin at any suitable value, such as a value corresponding to 2100 PPM, 2500 PPM, or higher. The threshold can be lowered continuously or in increments, manually or automatically. For instance, a user can select the starting threshold and gradually lower the threshold until a trigger event is detected. Alternatively, the oscilloscope 200 can include a feature in which the starting threshold is automatically selected, and the threshold is automatically lowered until the trigger event is detected. In this manner, there is a much higher probability of localizing the area of greatest interest in the SSC, and determining whether the SSC signal is within expected tolerances, and if not, how far out of tolerance it is.

Figure 4:
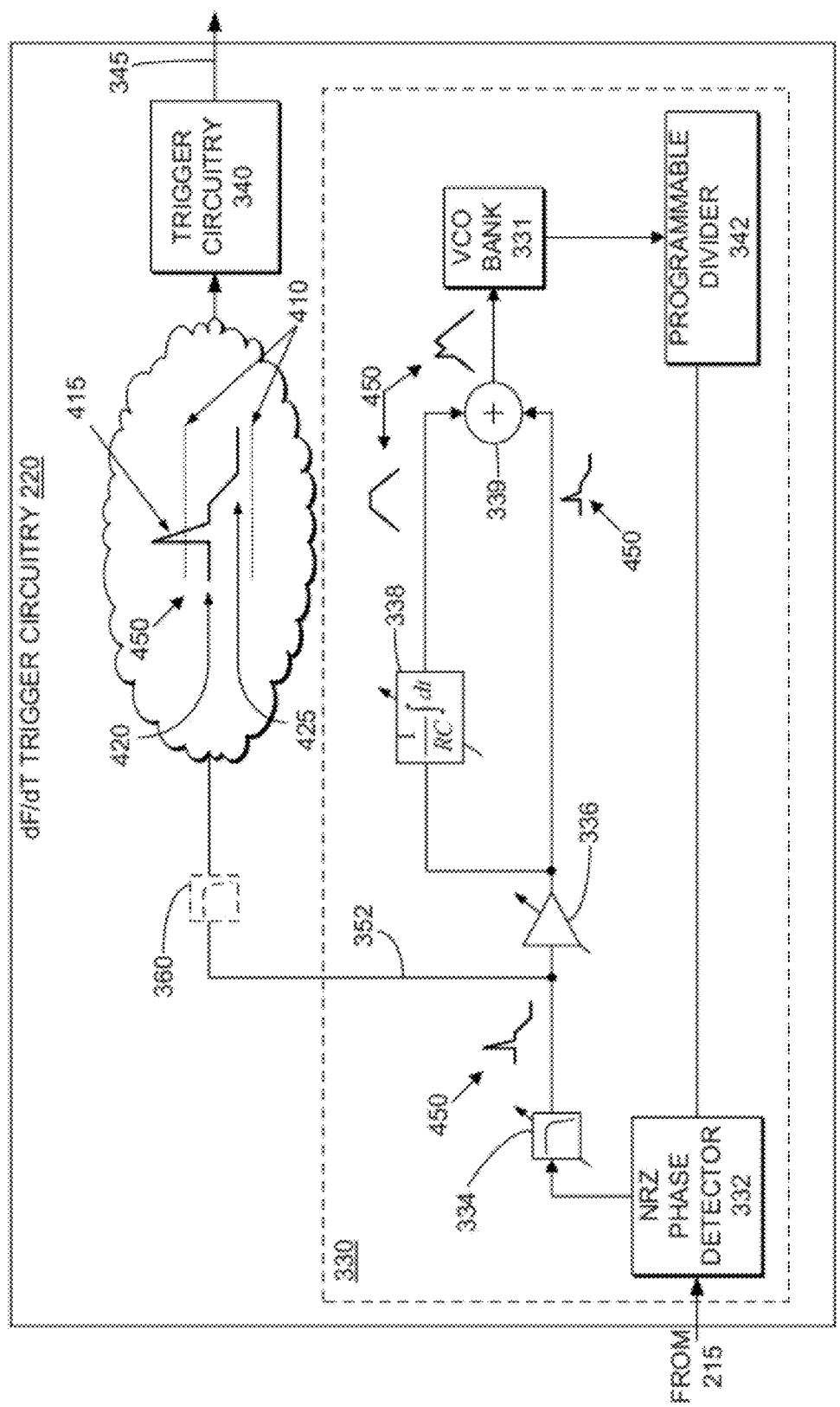
FIG. 4 illustrates additional aspects of the dF/dT trigger circuitry of FIG. 3, according to some embodiments of the present invention.

FIG. 4 illustrates additional aspects of the dF/dT trigger circuitry 220 of FIG. 3, according to some embodiments of the present invention. The components generally correspond to those described above with reference to FIG. 3, and for the sake of brevity, that discussion will not be repeated. In addition, FIG. 4 shows various example stages of the SSC signal 450 as it is processed by the PLL circuit 330. The SSC signal 450 is received by the trigger circuitry 340 after being processed by the adjustable low-pass filter 334.

Voltage levels 420 and 425 represent voltages proportional to or falling within an expected SSC profile. The expected SSC profile is one in which components of the SSC signal fall within user-defined or predefined definitions or limits, and do not fall outside of the same, as discussed above. If components of the SSC signal fall outside of thresholds 410, the expected SSC profile is violated, and a trigger event occurs. Thresholds 410 can be configured or preset using the trigger circuitry 340. If an excess or deviant voltage is detected, due to an excessive SSC signal beyond that which is expected, such as excursion 415 extending or crossing beyond the upper threshold 410, then the trigger circuitry 340 triggers on the event and outputs trigger event 345. Similarly, an excursion can extend beyond or cross the lower threshold 410, which can also cause the trigger event 345.

Figure 5:
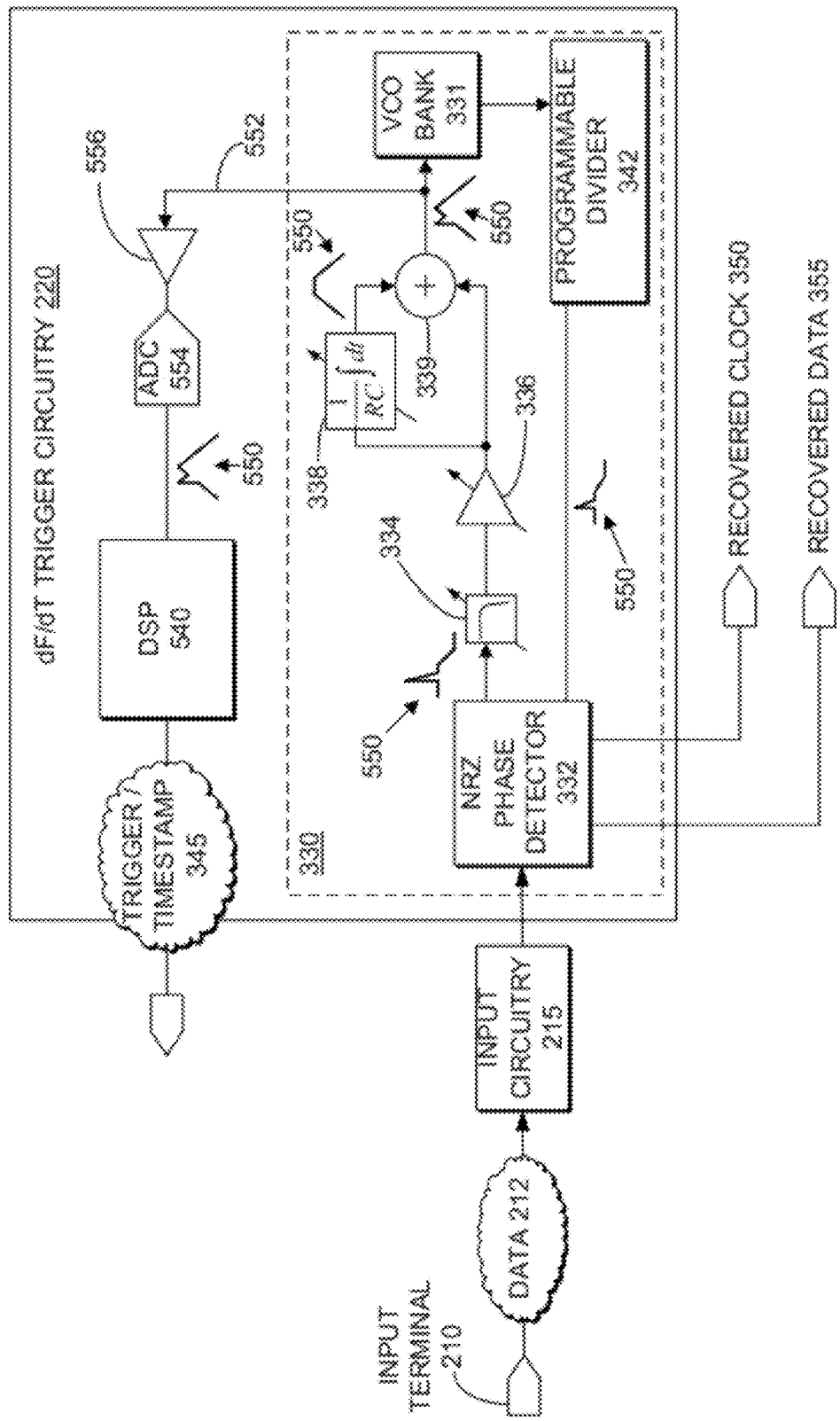
FIG. 5 illustrates the dF/dT trigger circuitry of FIG. 2, including a digital signal processor, according to some embodiments of the present invention.

FIG. 5 illustrates the dF/dT trigger circuitry 220 of FIG. 2, including a digital signal processor 540, according to some embodiments of the present invention. A summer 339 adds the output signals of the adjustable integrator 338 and the adjustable gain component 336 and produces a summed output. The summed output from the summer 339 tracks the data input frequency from the SSC signal, and generates a frequency profile, which is processed in a digital signal processor (DSP) 540. The path in which the adjustable integrator 338 is situated is generally referred to herein as the integral output path or simply the integral path. The negative feedback inherent in the PLL reproduces at the VCO Bank 331 input all components of the SSC signal 550 up to the PLL loop bandwidth, which in this case would be set fairly high, for example to 50 MHz. An analog-to-digital converter (ADC) 554 is coupled to the PLL circuit. The ADC can support, for example, sample rates of up to 100 MS/s or thereabout. Persons with skill in the art will recognize that processing speeds of components such as the PLL and ADC can increase over the course of time, and therefore any bandwidth and sample rate is contemplated as falling within the scope of this disclosure. The ADC 554 receives and digitizes the summed output signal received from the PLL circuit.

The DSP 540 is coupled to the ADC 554, and receives the digitized signal from the ADC 554. The DSP 540 can be implemented, for example, using an FPGA, thereby facilitating subsequent upgrades to new standards or SSC profile algorithms. The DSP 540 produces the trigger event 345 when the digitized signal violates a predefined expected SSC standard, profile, mask, and/or pattern.

The expected SSC standard, profile, mask, and/or pattern is one in which the digital components of the SSC signal fall within user-defined or predefined definitions or limits, and do not fall outside of the same, as discussed above. In other words, the DSP compares the summed output signal of the PLL to the predefined expected SSC standard, profile, mask, and/or pattern, and produces the trigger event 345 responsive to the comparison. In some embodiments, the DSP 540 separates high-frequency components and low-frequency components of the signal received from the PLL circuit to assist in the comparison to the SSC standard, profile, mask, and/or pattern. In some embodiments, the signal received from the PLL is compared by the DSP 540 to a predefined waveform mask, and if the signal falls outside of the predefined waveform mask, then the trigger event 345 is produced.

In some embodiments, the derivative of the components of the SSC signal can be taken mathematically to pick out large rate changes in the SSC profile for comparison against the predefined expected SSC standard, profile, mask, and/or pattern. The signal is preferably well-filtered to remove higher frequency phase noise outside of what is considered to be SSC.

Moreover, the filter and/or matching algorithm for the SSC profile can be easily modified in view of evolving SSC profile standards. For instance, by simply upgrading the FPGA code to use an updated filter and/or matching algorithm, the expected SSC profile or other defined limitations can be maintained, even after the oscilloscope 200 may have been configured for manufacturing, or even shipped into the marketplace.

The dF/dT trigger circuitry of claim 220 can include an anti-aliasing filter 556 disposed between the ADC 554 and the PLL circuit 330, to improve performance and reduce the amount of aliasing that might be present in the SSC signal 550. The anti-aliasing filter 556 can provide a 50 MHz filter. Persons with skill in the art will recognize that processing speeds of components such as the anti-aliasing filter can increase over the course of time, and therefore any bandwidth is contemplated as falling within the scope of this disclosure.

Figure 6:
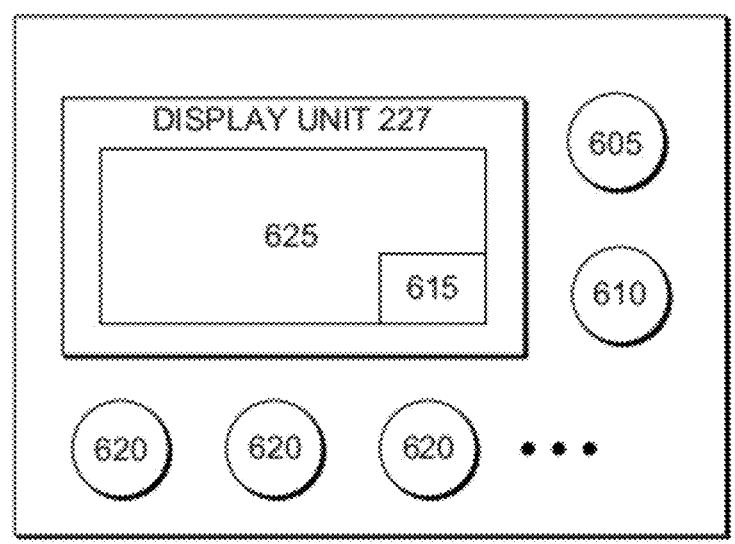
FIG. 6 illustrates a test and measurement instrument including inputs for configuring the dF/dT trigger according to some embodiments of the invention.

FIG. 6 illustrates a test and measurement instrument 600 including inputs 605, 610, 615, and/or 620 for configuring the dF/dT trigger according to some embodiments of the invention. The test and measurements instrument 600 can correspond to the oscilloscope 200 of FIG. 2, the features of which are described above. The display unit 227 can include display 625 for displaying the SSC signals, dF/dT trigger thresholds, and so forth. Input 615 can receive user input through the display 625 to enable or otherwise configure the dF/dT trigger thresholds or other related dF/dT trigger settings. For example, input 615 may include one or more menu options to enable or otherwise configure the dF/dT trigger.

In addition, inputs 605, 610, and/or 620 can be used to enable or otherwise configure or adjust the dF/dT trigger thresholds or other related dF/dT trigger settings. For example, input 605 can be used to enable the dF/dT trigger, input 610 can be used to select the various thresholds and/or profiles of the SSC signal, and inputs 620 can be used to adjust the position of the SSC signal after the trigger event is produced. The user of the oscilloscope can configure and manipulate any of the dF/dT trigger thresholds and/or settings using any of the inputs.

FIG. 7 illustrates a flow diagram 700 showing a technique for receiving an SSC signal and producing a trigger event. The methods disclosed herein include instantaneously triggering on a frequency deviation associated with an SSC signal. The method begins by receiving an SSC data signal at a terminal of a test and measurement instrument, such as oscilloscope 200, as shown at 705. At 710, the SSC signal is recovered and low-pass filtered along a proportional path of a PLL circuit. As mentioned above, the feedback loop around the integrator also performs a high-pass function at this node, which serves the purpose of estimating the derivative (i.e., dF/dT) of the SSC signal. Such high-pass filtering is not needed if the signal is digitized and processed using the DSP 540; hence, as shown in FIG. 5, the signal is picked off at the input of the VCO 331 (i.e., the output of the summer 339). At 715, a determination is made whether to digitize the SSC signal. This determination can be made prior to manufacturing the oscilloscope 200, or alternatively, the determination can be built into the oscilloscope 200 so that either option is immediately available to the user.

If the determination at 715 is NO, then the flow proceeds to 740 and the low-pass filtered SSC signal is transmitted from the PLL circuit to the trigger circuitry. At 745, another determination is then made using the trigger circuitry whether the frequency deviation in the filtered SSC signal exceeds or crosses one or more trigger thresholds. If YES, then the flow proceeds to 750 and a trigger event is produced using the trigger circuitry. If NO, the flow returns to the start for further processing.

Otherwise, if the determination at 715 is YES, then the flow proceeds to 725. The sum of the proportional and integral paths of the PLL circuit is transmitted from the PLL circuit to the ADC at 725, and is thereafter digitized at 730. At 735, a determination is made, using the DSP, whether to produce the trigger event. If the frequency profile of the digitized signal violates the predefined expected SSC standard, profile, mask, and/or pattern then the flow proceeds to 750 and the trigger event is produced by the DSP. In other words, the digitized frequency profile of the SSC signal is compared to the predefined expected SSC standard, profile, mask, and/or pattern using the DSP, and the trigger event is produced responsive to the comparison. The summed signal can optionally be anti-aliased prior to being transmitted to the ADC. If the determination at 735 is NO, the flow returns to the start for further processing.

Although particular embodiments have been described, it will be appreciated that the principles of the invention are not limited to those embodiments. For example, while the embodiments mentioned above describe different properties of the SSC signal, the properties described above are not limited to SSC properties per se, but rather, can extend to jitter measurements and the like or other types of statistical measurements. For instance, further analysis can be performed on the measurements such as statistics, histograms, etc. Statistical values such as minimum, maximum, mean, average, standard deviation, and so forth, can be applied to the measurements. It should be understood that other analysis types can include trend plots of measurement values, histograms, and so forth.

Moreover, by progressively lowering the trigger threshold, one can be more certain that the data being analyzed represents a "worse" case signal content rather than an arbitrary time window that an oscilloscope happens to acquire or capture. In addition, decision feedback equalizer (DFE) filters, or other suitable filters, can be implemented or applied to the SSC signal before or after processing by the dF/dT trigger circuitry.

In some embodiments, an article drawn from the set including floppy disks, optical disks, fixed disks, volatile memory, non-volatile memory, random access memory, read-only memory, or flash memory, comprising a machine-accessible medium having associated instructions that, when executed in a test and measurement instrument, results in a machine performing the steps of the various embodiments of the invention as disclosed herein. Other variations and modifications may be made without departing from the principles of the invention as set forth in the following claims.

What is claimed is:

1. A test and measurement instrument, comprising:
an input terminal to receive a signal;
first input circuitry to receive the signal from the input terminal;
second input circuitry structured to receive an input from a user to configure one or more trigger thresholds; and
delta Frequency/delta Time (dF/dT) trigger circuitry coupled to the first input circuitry, the dF/dT trigger circuitry configured to receive the signal from the first input circuitry, measure frequency deviation rates, and produce a trigger event in real-time when each frequency deviation rate of the signal violates a predefined pattern,
wherein the trigger event includes at least one of a trigger signal or a timestamp.

2. The test and measurement instrument of claim 1, wherein the dF/dT trigger circuitry is configured to produce the trigger event when the dF/dT of the signal crosses the one or more trigger thresholds.

3. The test and measurement instrument of claim 2, wherein the one or more trigger thresholds are user-definable.

4. The test and measurement instrument of claim 2, wherein the one or more trigger thresholds are predefined.

5. The test and measurement instrument of claim 2, wherein the signal is a data signal based on a spread spectrum clock (SSC) signal.

6. The test and measurement instrument of claim 2, further comprising:
circuitry including a phase detector and an adjustable low pass filter coupled to the phase detector, and structured to produce a proportional path output signal of a phase lock loop (PLL), wherein:
the dF/dT trigger circuitry includes trigger circuitry coupled to an output of the adjustable low pass filter and structured to receive the proportional path output signal of the PLL; and
the trigger circuitry is structured to produce the trigger event responsive to the proportional path output signal of the PLL.

7. The test and measurement instrument of claim 1, wherein the dF/dT trigger circuitry is configured to produce the trigger event when the dF/dT of the signal violates a waveform mask.

8. The test and measurement instrument of claim 1, wherein:
the dF/dT trigger circuitry includes:
a phase lock loop (PLL) circuit;
an analog-to-digital converter (ADC) coupled to the PLL circuit; and
a digital signal processor (DSP) coupled to the ADC, wherein:
the ADC is structured to receive and digitize a signal received from the PLL circuit; and
the DSP is structured to receive the digitized signal and produce the trigger event when the digitized signal violates a predefined expected pattern.

9. The test and measurement instrument of claim 8, wherein:
the predefined expected pattern includes a predefined expected spread spectrum clock (SSC) pattern; and
the DSP is structured to produce the trigger event when a dF/dT peak violates the predefined expected SSC pattern.

10. The test and measurement instrument of claim 8, wherein:
the signal received from the PLL circuit includes a sum of an integral path of the PLL and a proportional path of the PLL; and
the DSP is structured to compare the summed signal to the predefined expected spread spectrum clock (SSC) pattern and produce the trigger event responsive to the comparison.

11. The test and measurement instrument of claim 8, wherein the DSP is structured to separate high-frequency components of the signal received from the PLL circuit from low-frequency components of the signal received from the PLL circuit.

12. The test and measurement instrument of claim 8, further comprising an anti-aliasing filter disposed between the ADC and the PLL circuit.

13. A method for instantaneously triggering on a frequency deviation, the method comprising:
receiving a signal at an input terminal of a test and measurement instrument;
low-pass filtering the signal along a proportional path of a phase lock loop (PLL) circuit;
transmitting the filtered signal from the PLL circuit to trigger circuitry;
measuring the frequency deviation rates of the signal;
triggering the test and measurement instrument using the trigger circuitry in real-time when each frequency deviation rate of the signal violates a predefined pattern; and
receiving input from a user of the test and measurement instrument to configure one or more trigger thresholds.

14. The method of claim 13, wherein the trigger circuitry triggers the test and measurement instrument when a delta Frequency/delta Time (dF/dT) of the signal crosses one or more trigger thresholds.

15. The method of claim 13, wherein the trigger circuitry includes an analog-to-digital converter (ADC) and a digital signal processor (DSP), the method further comprising:
summing the proportional path of the PLL circuit and an integral path of the PLL circuit to produce a summed signal;
transmitting the summed signal to the DSP; and
triggering the test and measurement instrument, using the DSP, when a delta Frequency/delta Time (dF/dT) event violates a predefined expected pattern.

16. The method of claim 15, further comprising anti-aliasing the summed signal.

17. The method of claim 15, further comprising:
digitizing the summed signal using the ADC;
comparing the digitized summed signal, including the dF/dT event, to the predefined expected pattern using the DSP; and
triggering the test and measurement instrument when the dF/dT event crosses one or more thresholds associated with the predefined expected pattern.

18. The method of claim 13, further comprising receiving input from a user of the test and measurement instrument to enable the triggering.

19. The method of claim 13, further comprising:
selecting a starting trigger threshold higher than an upper threshold determined by a predefined expected pattern; and
progressively lowering the trigger threshold from the starting trigger threshold to the upper threshold until a delta Frequency/delta Time (dF/dT) event in the filtered signal crosses the progressively lowering threshold.

20. The method of claim 13, wherein the signal is a data signal based on a spread spectrum clock (SSC) signal.

21. A non-transitory computer-readable medium having associated instructions that, when executed in a test and measurement instrument, results in a machine performing the steps of claim 13.

* * * * *